United States Patent

Glass

[15] 3,651,564

[45] Mar. 28, 1972

[54] METHOD OF MANUFACTURING RADIATION-SENSITIVE SEMICONDUCTOR DEVICES

[72] Inventor: William Brian Glass, London, England

[73] Assignee: Westinghouse Brake and Signal Company Limited, London, England

[22] Filed: Jan. 24, 1969

[21] Appl. No.: 793,742

[30] Foreign Application Priority Data

Feb. 2, 1968 Great Britain........................5,361/68

[52] U.S. Cl. ................................29/574, 29/588, 250/211 J

[51] Int. Cl........................................B01j 17/00, H01l 7/00

[58] Field of Search.................317/235; 29/572, 576 B, 576, 29/574; 250/211 J; 136/89; 324/20

[56] References Cited

UNITED STATES PATENTS

| | | | |
|---|---|---|---|
| 3,072,796 | 1/1963 | Eaton | 250/211 |
| 3,160,520 | 12/1964 | Jäntsch | 117/201 |
| 3,222,530 | 12/1965 | Kolhammer | 250/211 |
| 3,417,253 | 12/1968 | Kadah | 250/233 |
| 2,766,144 | 10/1956 | Lidow | 117/200 |
| 3,517,198 | 6/1970 | Phillipp | 250/211 |
| 3,261,074 | 7/1966 | Beauzée | 29/572 |

*Primary Examiner*—John F. Campbell
*Assistant Examiner*—W. Tupman
*Attorney*—Larson, Taylor & Hinds

[57] ABSTRACT

A method of manufacturing semiconductor devices of the type including a radiation-sensitive region wherein the radiation-sensitive region of each device is purposely made to have a sensitivity greater than a required sensitivity. The sensitivity of each device is then determined and a translucent screen is provided for the device, the translucence of the screen being dependent upon the radiation sensitivity of the particular device.

7 Claims, 1 Drawing Figure

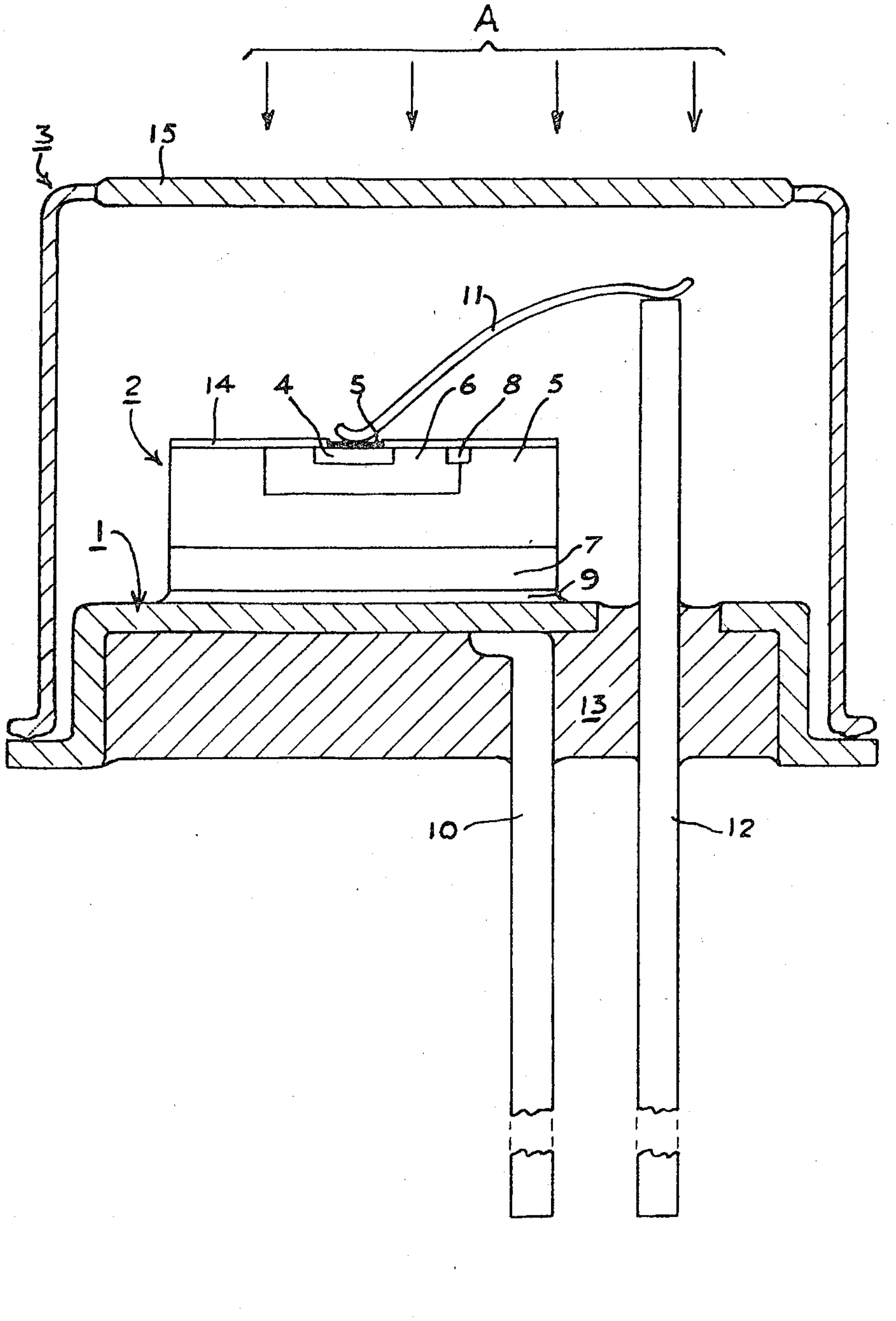
A
3
15
11
2
14
4
5
6
8
5
1
7
9
13
13
10
12

METHOD OF MANUFACTURING RADIATION-SENSITIVE SEMICONDUCTOR DEVICES

This invention relates to semiconductor devices and to their manufacture.

The present invention provides a semiconductor device having an encapsulated semiconductor element, a region of which element is radiation-sensitive, the device including a radiation-translucent screen through which radiation must pass to reach the region.

The radiation to which the region is sensitive may be visible light.

The region may constitute the means by which a further region of the device is switched between an electrically conductive and electrically non-conductive condition.

The screen may be contained in the encapsulation of the element (by being a translucent coating on the window in the encapsulation) or may be constituted by a coating on the region in which latter case the coating may contain as the translucence-determining material, alazarin.

The present invention also provides the method of manufacturing devices as above specified, which method includes the steps of determining the radiation sensitivity of the radiation-sensitive region and thereafter providing a screen the degree of translucence of which to the radiation is dependent upon the radiation sensitivity of the radiation-sensitive region.

Where the screen is contained in the encapsulation of the element, the method includes the step of encapsulating the element in a capsule incorporating a screen having the dependent degree of translucence.

Alternatively, where the screen is to be constituted by a coating on the region, the concentration of the translucence-defining material in the coating is chosen to determine the dependent degree of translucence of the coating. Alternatively, it may be the thickness of the coating which is chosen to determine the dependent degree of the translucence of the coating.

One type of semiconductor device to which the present invention is applicable is shown, in cross-section, in the accompanying drawing.

The device shown in the drawing (which is well known of itself) comprises a base 1 on which is mounted a semiconductor element 2 encapsulated by the base 1 and a cap 3.

The element 2 has therein N-type conductivity regions 4 and 5, P-type conductivity regions 6 and 7 and an N+ region 8.

The element 2 is mounted on the base 1 by a solder layer 9 so that the P-type conductivity region 7 is electrically connected to the base 1 and therethrough to a lead 10. Similarly, the region 4 is connected by solder 5 with a lead 11 itself connected to a further lead 12 which further lead 12 is electrically insulated from the base 1 by electrically insulating material 13 which serves not only electrically to insulate the further lead 12 but to secure that lead 12 and the lead 10 in position relative to the base 1.

As is usual with these types of devices, the element 2 is provided on its upper surface with a passivated oxide coating 14.

The element 2 above described is, when light is not falling on it, in its non-conductive condition. The incidence of light on to the surface of the region 6 switches the element 2 into its conducting condition.

In order to allow light to fall on the region 6, the cap 3 is provided with a glass window 15 through which light falling in the direction of the arrows A can pass through the capsule on to the surface of the region 6.

The problem with the manufacture of devices of the kind described above is that of sufficiently closely controlling the manufacture of the semiconductor element so as to include a region (the region 6) whose photosensitivity is consistent from element to element.

This problem is overcome by the present invention by, in the manufacture of the element 2, making the region 6 ultra-sensitive to light and subsequently shielding the photosensitive region 6 from the light falling on that region by the interposition of a translucent screen.

This screen may be incorporated in the capsule of the device by coating the underside of the glass window 15 with a coating of translucent material by means of which there is allowed to fall on the region 6 only a proportion of the light which is incident on the device. Aluminum has been found a suitable material. Hence, by suitable choice of the density and thickness of the coating, although the element 2 is itself ultra-sensitive, the device as a whole can be produced to any desired degree of sensitivity.

As an alternative to a coating on the inside of the window 15, the screen may be constituted by a coating on the photosensitive region 6 and, in this case, the translucent material may be a settable alazarin solution. However, the overall effect will be the same, namely, that even though the element 2 be basically of itself ultra-sensitive the device as a whole can be made to any desired degree of sensitivity.

In either arrangement, the desired degree of sensitivity may be brought to the required level by determining the thickness of the coating which is of a material of a predetermined concentration of alazarin or by determining the concentration of alazarin in a coating of predetermined thickness.

By the provision of the screen as above described, a less exact control of the photosensitivity of the region 6 is necessary during the manufacture of that region for after the manufacture of a batch of elements 2, the elements can be graded in accordance with their photosensitivity and then subsequently encapsulated in an encapsulation of which the coating of the glass window 15 is arranged to provide the necessary degree of translucence, or by coating the photosensitive region 6 with a translucent coating either the density of which or the thickness of which is dependent upon the photosensitivity of the photosensitive region 6, to render the device as a whole photosensitive to the required degree.

Whilst, in the above described example, the region 6 is sensitive to visible light, devices are known which are sensitive to other forms of radiation but the same principle as has been described above for use with photosensitive devices can be used for other radiation-sensitive devices, the coating allowing these other radiations to pass through while excluding any radiation which would give spurious outputs from the device.

I claim:

1. A batch processing method for producing a batch of semiconductor devices having a consistent sensitivity to radiation, said devices each including a semiconductor element having a region which is radiation-sensitive, including the steps of:

a. forming the radiation-sensitive region of the elements such that the sensitivity to radiation of the elements is greater than a predetermined, desired sensitivity to radiation,
b. determining the sensitivity of the said radiation-sensitive region of each element,
c. selecting translucent screens for said elements each having a degree of translucence chosen in accordance with the radiation sensitivity determined for a corresponding element in step (b) and the desired consistent sensitivity of the devices, and
d. providing each element with a said translucent screen to control the sensitivity of the radiation-sensitive region of that element, the element and associated screen being mounted to produce a semiconductor device of the requisite consistent sensitivity.

2. A method as claimed in claim 1 further comprising the step of encapsulating the elements in a capsule incorporating a said screen.

3. A device as claimed in claim 1 furthering comprising and capsulating said elements in capsules having a window, and coating each said window with a translucent coating to form said screen.

4. A method as claimed in claim 1 further including forming a screen as a coating on said radiation-sensitive region.

5. A method as claimed in claim 4 wherein the thickness of said coating is chosen to determine the said degree of translucence of said screen.

6. A method as claimed in claim 4 wherein the concentration of a material within the coating which determines the translucence thereof is chosen to determine the degree of translucence of the screen.

7. A method as claimed in claim 6 wherein said material comprises alizarin, said radiation-sensitive region being responsive to the incidence of radiation thereon to switch a further region of the device between an electrically conductive and an electrically nonconductive condition.

* * * * *